United States Patent [19]
Ishii et al.

[11] Patent Number: 5,804,083
[45] Date of Patent: Sep. 8, 1998

[54] METHOD OF FORMING A MICROSTRUCTURE

[75] Inventors: Yorishige Ishii, Yamatotakada; Tetsuya Inui, Nara; Hirotsugu Matoba, Sakurai; Susumu Hirata, Ikoma-gun; Masaharu Kimura, Daito; Hajime Horinaka, Kashiba; Shingo Abe, Tenri; Hiroshi Onda, Yamatokoriyama, all of Japan

[73] Assignee: Sharp Kabushiki Kaisha, Osaka, Japan

[21] Appl. No.: 653,050

[22] Filed: May 28, 1996

[30] Foreign Application Priority Data

Jun. 28, 1995 [JP] Japan ................................. 7-162674

[51] Int. Cl.$^6$ ................................. B41J 2/05; C23F 1/00
[52] U.S. Cl. ................................. 216/2; 216/27; 216/95
[58] Field of Search ................................. 216/2, 27, 49, 216/17, 11, 56, 95

[56] References Cited

U.S. PATENT DOCUMENTS

| | | | |
|---|---|---|---|
| 4,434,224 | 2/1984 | Yoshikawa et al. | 430/323 |
| 5,376,231 | 12/1994 | Matsumoto et al. | 156/656 |
| 5,478,606 | 12/1995 | Ohkuma et al. | 427/555 |
| 5,524,784 | 6/1996 | Shiba et al. | 216/27 |
| 5,683,591 | 11/1997 | Offenberg | 216/2 |
| 5,698,112 | 12/1997 | Naeher et al. | 216/2 |

FOREIGN PATENT DOCUMENTS 6-39939  2/1994  Japan .

*Primary Examiner*—R. Bruce Breneman
*Assistant Examiner*—Anita Alanko
*Attorney, Agent, or Firm*—Nixon & Vanderhye P.C.

[57] ABSTRACT

Method of forming a complex, minute three-dimensional structure, known as micromachining, which includes forming a plurality of thin films at least one of which is provided as a temporary layer composed of a lower layer made of an organic material and an upper layer made of an amphoteric metal material which is formed on the lower layer; and selectively removing the temporary layer to provide a three-dimensional structure. The temporary layer may comprise a composite sacrificial layer of photoresist and aluminum.

19 Claims, 12 Drawing Sheets

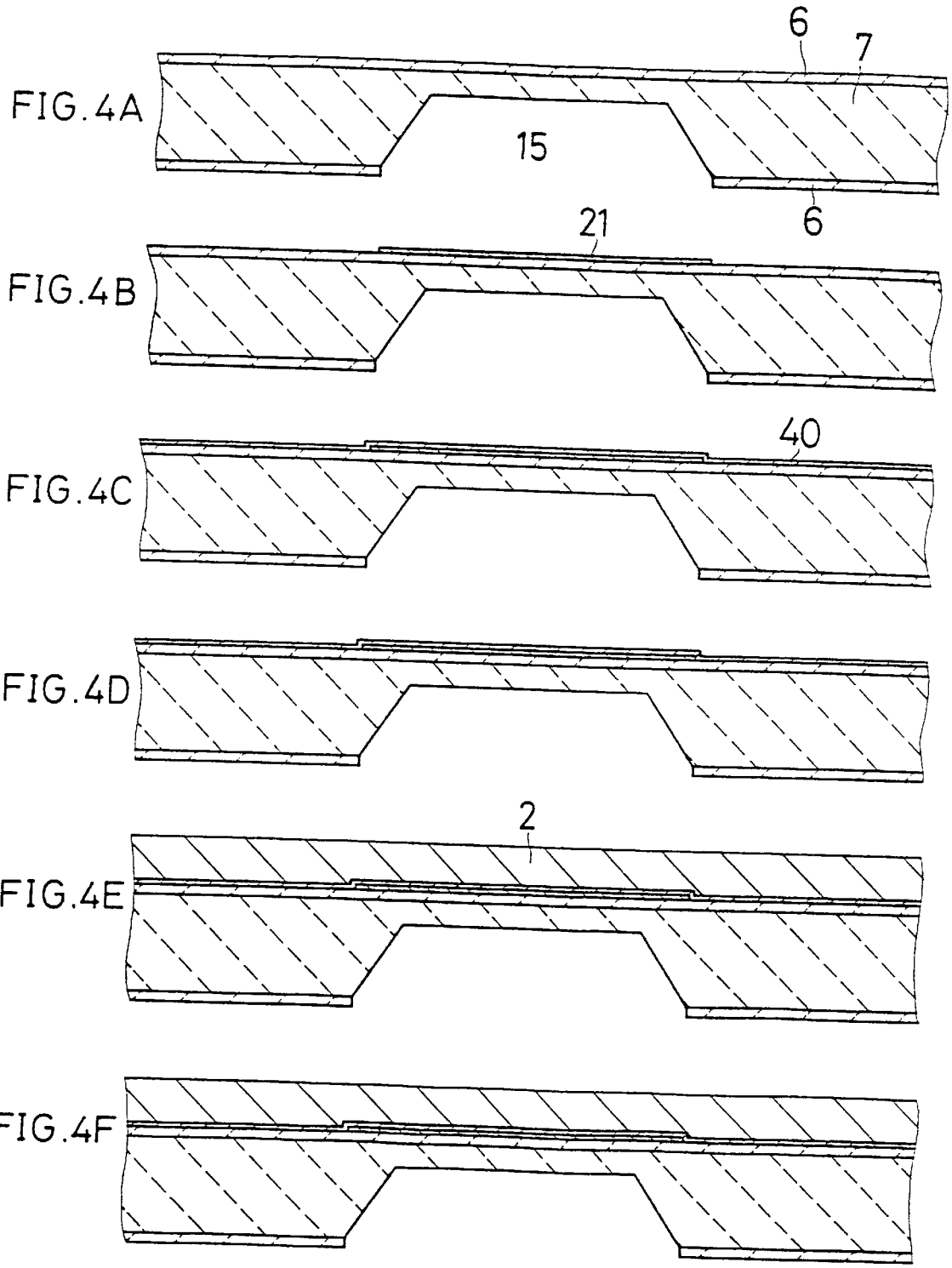

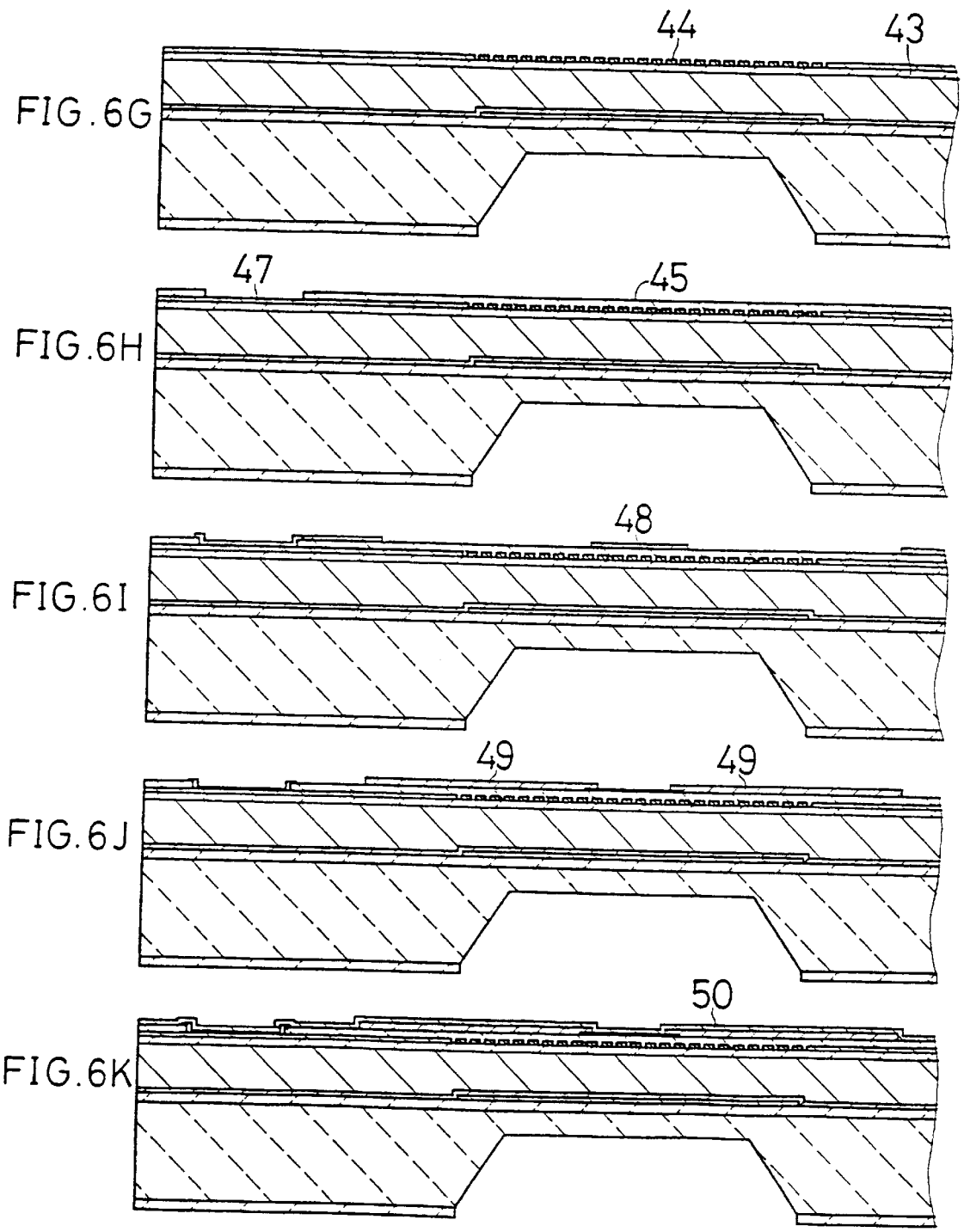

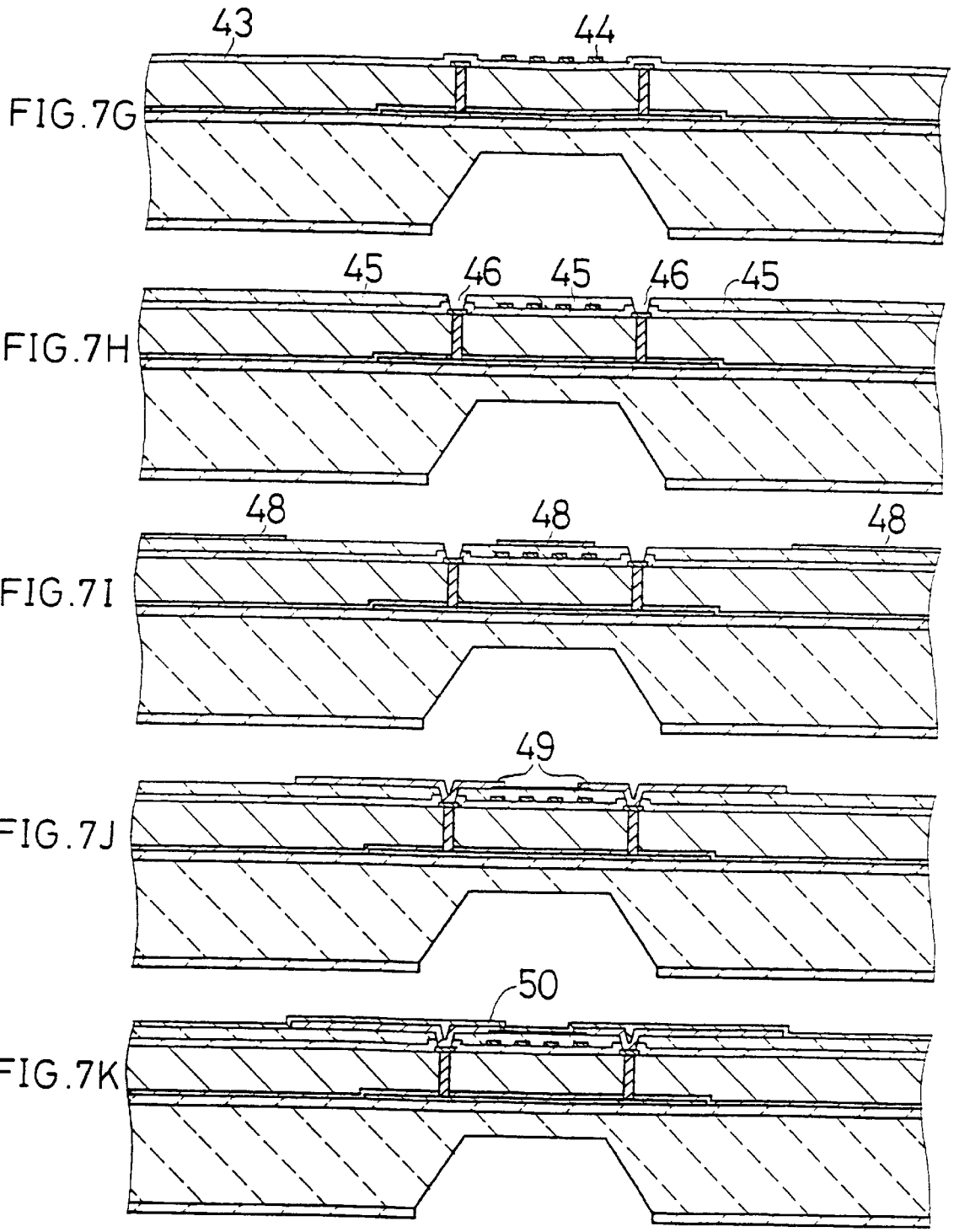

METHOD OF FORMING A MICROSTRUCTURE

BACKGROUND OF THE INVENTION

1. Field of the Invention

The present invention relates to a method of forming a microstructure which involves use of a temporary layer which is readily removable in a selective manner, as a method of producing a minute three-dimensional structure, referred to as "micromachining".

Throughout the specification, "amphoteric metal" means a metal capable of dissolving in both acids and alkalis, such as aluminum (Al) and zinc (Zn).

2. Description of the Related Art

Past attempts have been made to miniaturize mechanical structures, which are still rather large compared to electronic circuits such as semiconductors, including formation of minute three-dimensional structures on silicon substrates. This formation, known as micromachining, often involves the use of a temporary layer of silicon oxide. This is because silicon oxide, when thermally treated in an oxygen atmosphere, readily forms an oxide film which is easily removable with hydrofluoric acid.

FIG. 10 is a view illustrative of a prior art method disclosed in Japanese Unexamined Patent Application Disclosure HEI 6-112509 wherein a polycrystalline silicon film is used as a temporary layer. As shown in FIG. 10A, on a glass substrate 111 there are layered a silicon nitride film 113, a temporary polycrystalline silicon film 115, a silicon nitride film 117, a polycrystalline silicon strain gauge 119, and a protective film 121 for the strain gauge 119, respectively. As shown in FIG. 10B, an etching pit 123 is then perforated through the silicon nitride films 117 and the protective film 121, and the temporary polycrystalline silicon film 115 is etched off through the pit 123 to create a space 125. A three-dimensional structure is thus produced, wherein the strain gauge 119 is covered with the protective film 121 and the silicon nitride film 117, and the space 125 is left to allow movement.

FIG. 11 and FIG. 12 illustrate another prior art method whereby an organic film is used as a temporary layer. FIG. 11 and FIG. 12 include cross sectional views and perspective views which correspond to FIG. 1 and FIG. 2 of Japanese Unexamined Patent Application Disclosure HEI 6-39939, except for the reference numerals which are incremented by 200. FIGS. 11A through 11F are views illustrative of the respective steps of the prior art, and FIGS. 12A through 12F show the shapes of a three-dimensional structure formed in each step.

In FIG. 11A and FIG. 12A, a base plate 201 is provided on a fixed plate 203 on which a guide pin 202 stands. On the base plate 201, there is laid a cavity plate 204 on which a casting mold 205 is situated. The positioning of the cavity plate 204 and the casting mold 205 is accomplished using the guide pin 202. A two-component resin 206 is injected from the casting mold 205 into the cavity formed in the cavity plate 204, and curing of the injected resin provides a moldings 207. In cases where it is necessary to provide the molding 207 with a rotating shaft, the shaft 208 is provided on the base plate 201 in advance. The cavity plate 204 and the casting mold 205 are then removed.

In FIG. 11B and FIG. 12B, a wax base material which melts below the deformation temperature of the resin constituting the moldings 207 is poured over the base plate 201 and the molding 207 to form a temporary layer 209. Here, a frame 210 is fixed on the fixed plate 203, around the guide pin 202 as the reference.

In FIG. 11C and 12C, a cavity plate 212 and then a casting mold 211 are layered around the reference guide pin 202, and the two-component resin 206 is again poured for a second molding to form a molded resin piece 213. Then, as shown in FIG. 11D and FIG. 12D, after removal of the casting mold 211 and the cavity plate 212, the frame 210 is fixed, and an additional temporary layer 209 is poured to flatten the surface. Thereafter, as shown in FIG. 11E and FIG. 12E, a cavity plate 215 and then a casting mold 214 are layered, the two-component resin 206 is again poured, and then, if necessary, a further temporary layer 209 is formed.

In FIG. 11F and FIG. 12F, the resin is finally cured, the temporary layers 209 are removed by melting or dissolution to provide a plurality of molded pieces 207, 213 and 216 on the base plate 201, in an assembled state.

In cases where a silicon oxide film is used as the temporary layer, however, since the silicon oxide film acts as a structure, and further as a protective film for the electronic circuit section and as an insulating film between the conductors, selective removal of the temporary layer often presents inconvenient problems. The same problems also occur when a metal film or a polycrystalline silicon film is used as the temporary layer. In addition, although CVD or PVD is often used as the film-forming method, it is difficult to form a thick film by these methods because of the film quality or due to considerations of productivity.

From the point of view of selective removal for the production of structures and provision of thick films, thin films made of organic materials act as more excellent temporary layers than silicon oxide films, polycrystalline silicon films and metal films. They are, however, susceptible to ion collisions or heat, since they are organic films. When subjected to ion collisions or when used at temperatures over a given value, the organic films become cured and lose their function as temporary layers. In addition, when a temporary layer is formed of a wax base material according to prior art disclosed in, for example, Japanese Unexamined Patent Application Disclosure HEI 6-39939 mentioned above, it is impossible to achieve the same surface levels for the structure portions and the structure-free portions, as exemplified in FIG. 11, because of thermal constriction and thus a step is inevitably produced. It is further to be noted that when layered, the lower organic film dissolves in the solvent contained in the upper organic film, and this also causes formation of a step.

SUMMARY OF THE INVENTION

It is an object of the present invention to provide a method of forming a microstructure which allows easy selective removal of a temporary layer for the formation of a structure, provision of a thick film, and easy provision of a three-dimensionally complex layered structure.

The invention relates to a method of forming a microstructure which is used for the production of a miniature part with a composite structure through formation of a plurality of layers as thin films and selective removal of at least one of the layers as a temporary layer, characterized by forming the temporary layer or sacrifical layer as a composite of a lower layer composed of an organic material and an upper layer composed of an amphoteric metal material which is formed on the lower layer.

The lower layer according to the invention is characterized by being completely covered with at least one of the upper layer and the constituent materials of the upper layer during the formation of the pattern of the upper layer.

The invention is further characterized in that the lower layer has a film thickness of 0.1–1 μm, and is selectively removed with an organic solvent, and the upper layer is selectively removed with a strongly alkaline aqueous solution.

The lower layer according to the invention is further characterized by having a film thickness of 1–100 μm.

The invention is further characterized in that one or more selectively removable thin films are layered on the temporary layer to form a plurality of temporary layers.

The invention is further characterized in that all the temporary layers are selectively removed at once with a strongly alkaline aqueous solution.

The invention is further characterized in that a positive-type photoresist is used as the organic material.

The invention is farther characterized in that aluminum is used as the amphoteric metal material.

The invention is further characterized in that the upper layer is formed on the lower layer through evaporation while maintaining the lower layer at a temperature lower than the deformation temperature of the organic material.

According to the invention, since the lower layer of a temporary layer is formed of an organic material, an organic solvent, typically acetone or xylene, for example, may be used as the removing solution. Further, since the upper layer of the temporary layer is formed of an "amphoteric metal" capable of dissolving in both acids and alkalis, such as aluminum (Al) or zinc (Zn), a strongly alkaline aqueous solution may be used as the removing solution as well. Constituent materials of three-dimensional structures formed by micromachining include a coating of crystal orientation-dependent alkali-resistant, single-crystal silicon (Si), silicon dioxide ($SiO_2$) or silicon nitride (SiN), a metal film which is represented by nickel (Ni) plating, etc., and use of an organic solvent or a strongly alkaline aqueous solution as the removing solution results in more selective removal than by use of a acidic removing solution which is represented by hydrofluoric acid. Covering the lower layer of the temporary layer made of an organic material with the upper layer of the temporary layer made of an amphoteric metal material protects the lower layer of the temporary layer against ion collisions during formation of a film as a constituent material of a three-dimensional structure which is layered on the upper layer, and against chemicals used for patterning, and further allows formation of a more complex structure with a flatter surface.

Also, according to the invention, since the lower layer constructed of an organic material is entirely covered with the upper layer constructed of an amphoteric metal material or with the material itself, the lower layer is satisfactorily protected against etching solutions and peeling solutions used for patterning the upper layer.

Also, according to the invention, since the lower layer of the temporary layer is formed as a thin film with a thickness of 0.1–1 μm, even in cases where the alkali resistance of the constituent material of the three-dimensional structure is poor, and the temporary layer has such a large area and small thickness as to delay permeation of the removing solution, removal of the lower layer, that is, the first step of removing the temporary layer, may be quickly accomplished using an organic solvent which is highly selective to the constituent material, etc. Permeation of a strongly alkaline aqueous solution, which is the removing solution for the upper layer, through the clearance formed after the lower layer has been removed, allows instant removal of the upper layer. The removal of the temporary layer may be accomplished in this way, without seriously impairing the constituent materials of the three-dimensional structure.

Also, according to the invention, since the lower layer is formed of a 1–100 μm-thick film constructed of an organic material, a thick structure may be formed.

Also, according to the invention, since the temporary layer is formed as a multiple layer, a structure in a more complex shape may be provided.

In addition, since films of organic materials are hydrolyzed in strongly alkaline aqueous solutions, the productivity may be improved according to the invention by selectively and instantly removing both the lower layer of the temporary layer which is made of an organic material and the upper layer made of an amphoteric metal material with a strongly alkaline aqueous solution, but not by removal of the lower layer with an organic solvent.

In addition, the use of a positive-type photoresist as the organic material for the formation of the lower layer of the temporary layer according to the invention allows simplification of the etching and peeling steps, and facilitates dissolution of the lower layer in a variety of organic solvents such as acetone. Positive-type photoresists are often used in the process for the production of semiconductor integrated circuits (ICs), and are highly compatible with IC production processes. When exposed to light, positive-type photoresists become more soluble in alkaline aqueous solutions, and this allows use of a commercially available peeling solution as the removing solution and provides other advantages.

In order to carry out the invention, the amphoteric metal material is preferably one capable of forming a film through evaporation of zinc, tin (Sn) or the like; use of aluminum is particularly advisable due to its compatibility with IC production processes and because a variety of processing methods may be used. Positive-type photoresists may be used effectively, since they have many advantages, such as being removable with suitable developing solutions.

Also, according to the invention, since the lower layer of the temporary layer is composed of an organic material, the lower layer is carbonized or cured by heat or by ion collisions and tends to become less removable. In cases where the upper layer of the temporary layer is formed by evaporation not involving ion collisions, and a positive-type photoresist is used as the lower layer, the organic film may be prevented from being carbonized and cured when it is formed at a temperature below 150° C.

BRIEF DESCRIPTION OF THE DRAWINGS

Other and further objects, features, and advantages of the invention will be more explicit from the following detailed description taken with reference to the drawings wherein:

FIGS. 4A through 4F are cross sectional views illustrative of the production process according to a third embodiment of the invention;

FIGS. 6G through 6K are yet other cross sectional views illustrative of the production process according to the third embodiment of the invention;

FIGS. 7G through 7K are yet other cross sectional views illustrative of the production process according to the third embodiment of the invention;

DETAILED DESCRIPTION OF THE PREFERRED EMBODIMENTS

Figure 1:
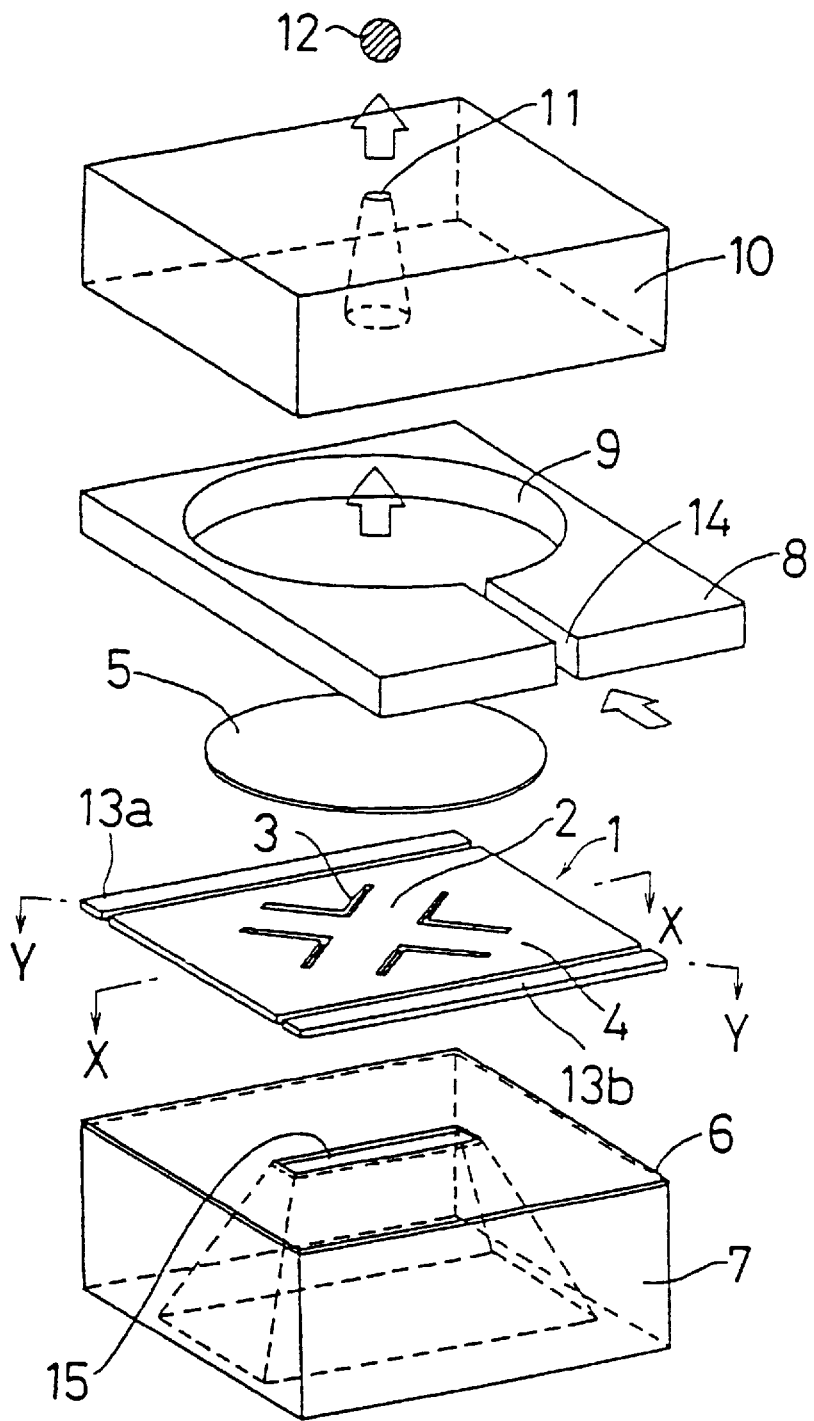
FIG. 1 is an exploded perspective view of an ink-jet head formed according to an embodiment of the present invention.

Now referring to the drawings, preferred embodiments of the invention are described below.

FIG. 1 is a view illustrative of the configuration of an ink-jet head provided with a buckling structure formed according to a first embodiment of the present invention. The buckling structure section 1 is formed of, for example, a nickel plating, and a buckling structure 2 in the center section is partitioned from a peripheral buckling structure supporting section 4 by a buckling assist groove 3. Above the buckling structure section 1, there is placed a diaphragm 5 which is formed of a nickel plating film, for example. Below the buckling structure section 1, there is provided a silicon substrate 7 having a top surface thereof covered with a thermal oxide film 6. Above the diaphragm 5, there is provided a spacer 8 formed of a synthetic resin, with an ink well 9 formed in its center. Above the ink well 9, there is provided a nozzle plate 10 with a nozzle orifice 11 formed through its center. An ink drop 12 is ejected 12 through the nozzle orifice 11.

Electrode sections 13a, 13b, provided at both sides of the buckling structure section 1, are connected to a heater (not shown). When the heater is energized through the electrode sections 13a, 13b, the buckling structure 2 is heated to initiate its buckling action due to thermal expansion to thereby push up the diaphragm 5. Pushing up the diaphragm 5 results in pressurizing the ink well 9 to cause ejection of ink which has flown in via an ink inlet passage 14, as the ink drop 12 through the nozzle orifice 11 of the nozzle plate 10. The side groove 15 provided in the silicon substrate 7 exerts back pressure on the buckling structure 2 to cause it to buckle toward the diaphragm 5. Since the diaphragm 5 is provided above the buckling structure 2, the diaphragm 5 is pushed up upon action of the buckling structure 2, and the force provided by the pushing up causes ejection of the ink drop 12. The ink-jet head is designed to function as described above.

Figure 2A:
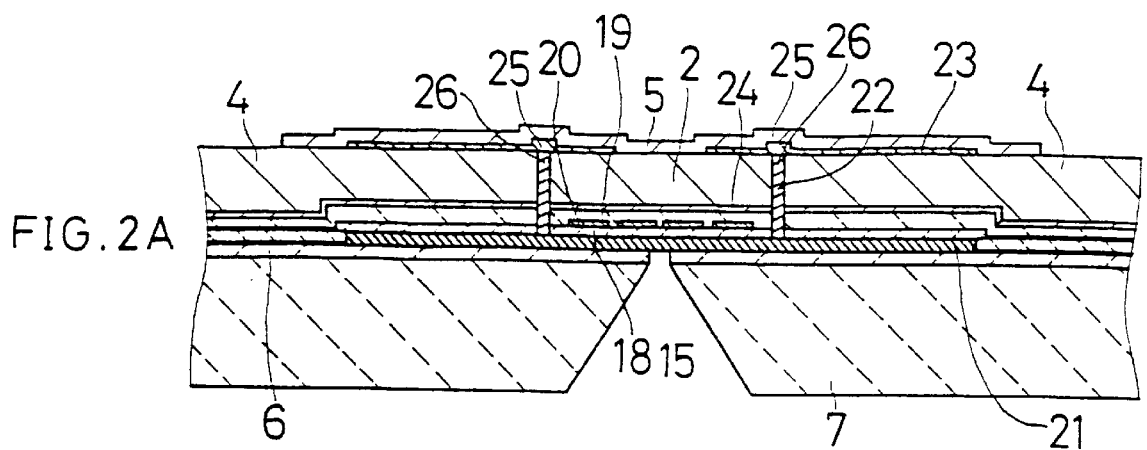
FIGS. 2A through 2D are cross sectional views illustrative of the production process according to a first embodiment of the invention.

FIGS. 2A through 2D show steps for formation of the ink-jet head of FIG. 1 according to an embodiment of the invention. FIGS. 2A through 2D are cross sectional views taken along the section line X—X in FIG. 1. FIG. 2A shows the state prior to the formation and removal of a temporary layer. Between the buckling structure 2 and the silicon substrate 7, there is provided a heater 20 covered with insulating films 18, 19. The insulating films 18, 19 are formed of silicon dioxide ($SiO_2$), for example. The heater 20 serves to heat the buckling structure, and is formed of nickel (Ni), for example. Formed between the insulating film 18 and the thermal oxide film 6 on the surface of the silicon substrate 7 is a first temporary layer 21 which is formed of an amphoteric metal such as aluminum (Al). A second temporary layer 22 is formed extending upward from the first temporary layer 21. The second temporary layer 22, composed of an organic material such as a positive-type photoresist formed as a thick film several μm in thickness, is formed by hard contact through contact exposure. On the top surface of the bucking structure 2, there is formed a third temporary layer 23 constructed of an amphoteric metal material such as aluminum, by low-temperature evaporation, which is intended to prevent carbonization and curing of the surface of the positive-type photoresist film constituting the second temporary layer 22. The combination of the second and the third temporary layers 22, 23 is an example of the combination of the upper layer and the lower layer of a temporary layer according to the invention. The second temporary layer 22 is a thick temporary layer which ensures provision of the buckling assist groove 3 in the buckling structure section 1. A contact layer 24 of tantalum (Ta) or the like is formed between the insulating film 19 and the buckling structure section 1.

If the third temporary layer 23 is formed by sputtering, then part of the surface of the second temporary layer 22 is cured, and as evidenced by the data given in the following Tables 1–3, removal of the temporary layer becomes difficult and it can no longer serve as a temporary layer.

TABLE 1

| Upper temporary layer-forming conditions | Sputtering | | |
|---|---|---|---|
| Lower temporary layer-removing means | Acetone | Peeling solution A | Peeling solution B |
| Removal of lower temporary layer | X | X | X |

TABLE 2

| Upper temporary layer-forming conditions | Low-power sputtering | | |
|---|---|---|---|
| Lower temporary layer-removing means | Acetone | Peeling solution A | Peeling solution B |
| Removal of lower temporary layer | X | X | Δ |

TABLE 3

| Upper temporary layer-forming conditions | Evaporation (EB evaporation) | | |
|---|---|---|---|
| Lower temporary layer-removing means | Acetone | Peeling solution A | Peeling solution B |
| Removal of lower temporary layer | O | O | O |

In Table 1, the temperatures of the peeling solutions are 100° C. Peeling solution A does not contain organic chlorine. Peeling solution B contains organic chlorine, and thus part of the metal material dissolves therein.

If the third temporary layer 23 is formed as a film constructed of an organic material such as polyimide, then NMP, the solvent for the polyimide film, dissolves the temporary layer 22 formed of a positive-type photoresist film. According to the present embodiment, since steps of several μm in height, close to the thickness of the buckling structure 2, occur at part 25 in FIG. 2A and at part 26 of the surface of the second temporary layer 22, the diaphragm 5 is of unsatisfactory quality. Accordingly, the temporary layer on the temporary layer 22 formed as a lower temporary layer of an organic material is preferably constructed of an amphoteric metal material capable of being formed as a film by evaporation at a temperature lower than the deformation temperature of the organic material which causes its carbonization or curing. According to the present embodiment, the third temporary layer 23 serving as the upper layer of the two-layer structure is formed by evaporation while maintaining its temperature lower than 150° C., the curing temperature of the positive-type photoresist film as the lower layer. This prevents curing and carbonization of the part 26 of the surface of the temporary layer 22, and thus facilitates removal of the temporary layer 22. The formation also serves to flatten the diaphragm 5, and thus provides the diaphragm 5 with a high level of reliability.

Figure 2B:
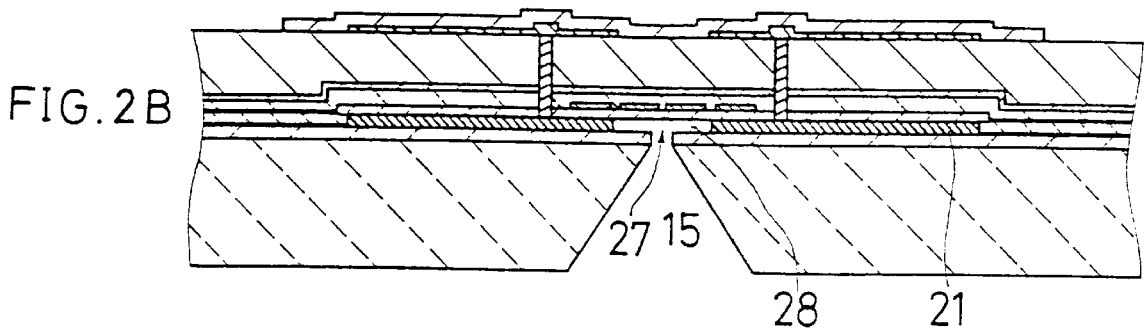
Figure 2C:
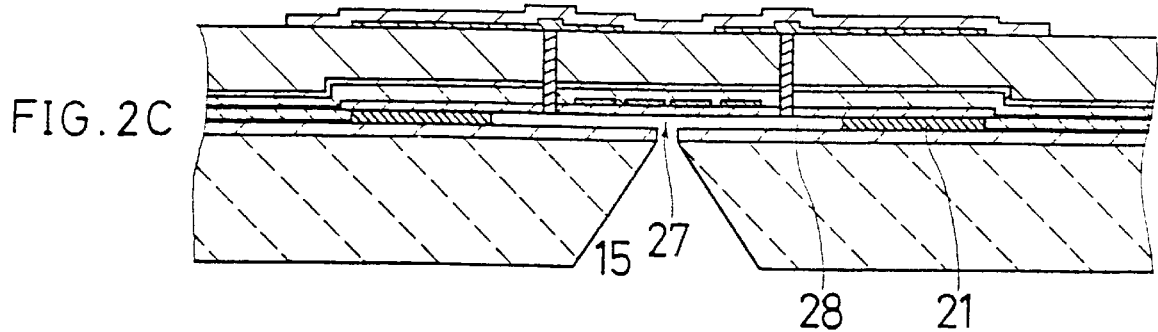
Figure 2D:
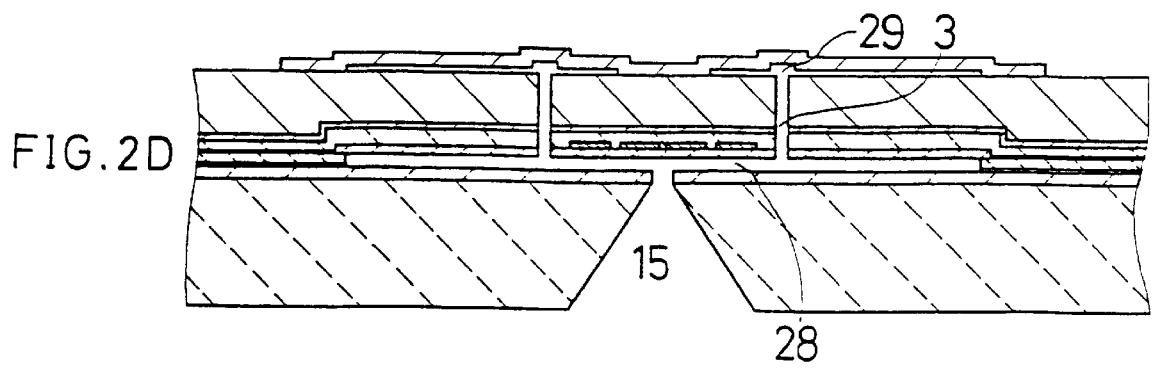
Figure 3A:
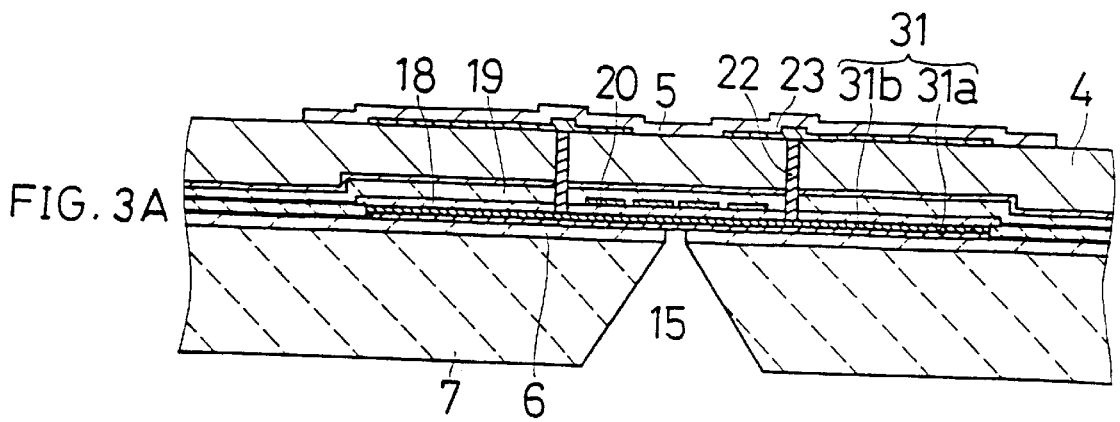
FIGS. 3A through 3D are cross sectional views illustrative of the production process according to a second embodiment of the invention.
Figure 3B:
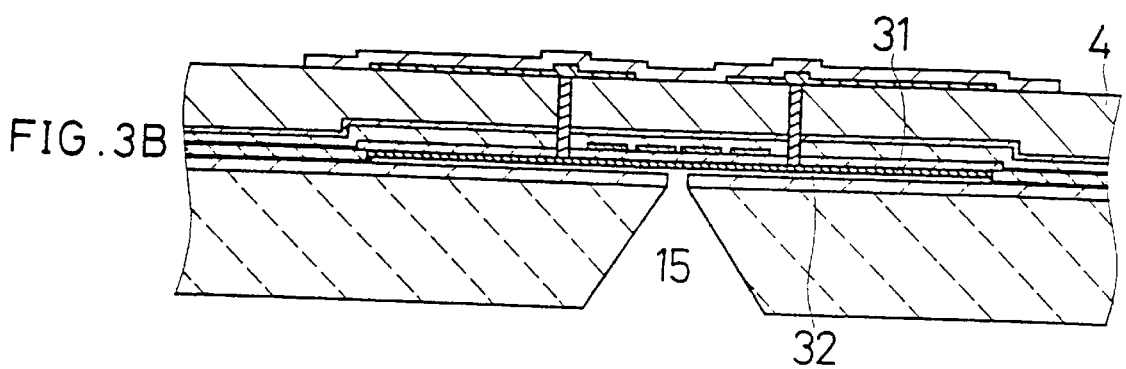
Figure 3C:
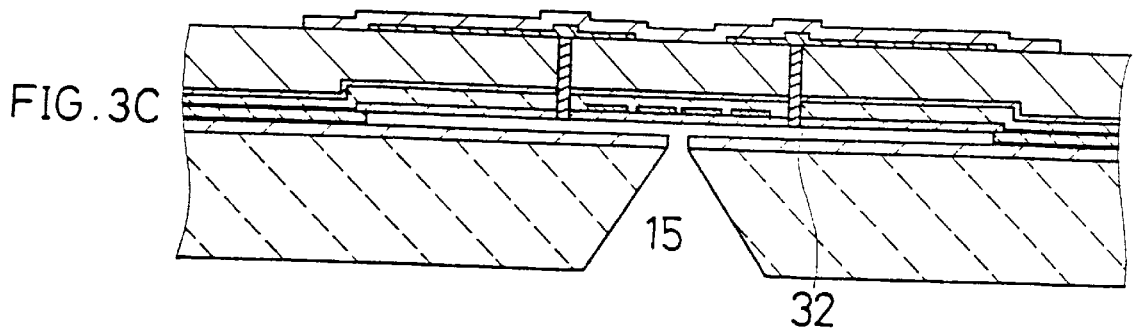
Figure 3D:
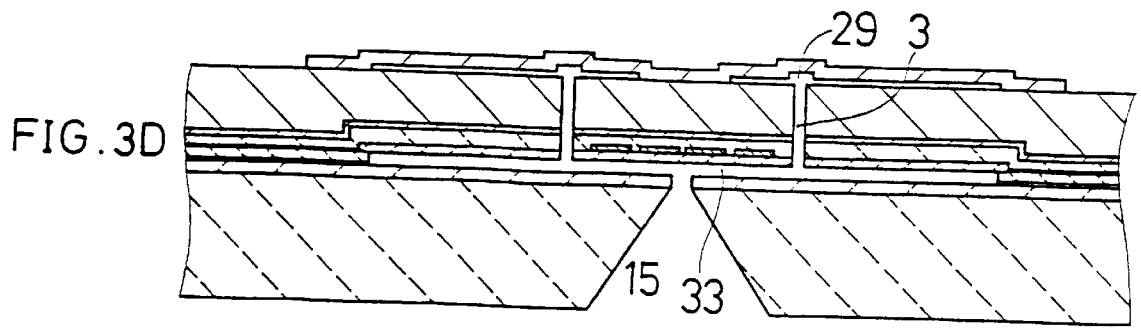

FIG. 2B illustrates procedures for forming a space 28 by application of a strongly alkaline aqueous solution 27 from the side of the underside of the silicon substrate 7 via the side groove 15 to remove part of the first temporary layer 21. Potassium hydroxide (KOH), for example, may be used as the alkali of the strongly alkaline aqueous solution. FIG. 2C illustrates the state where removal of the first temporary layer 21 is progressing. FIG. 2D illustrates the state where the first temporary layer 21, the second temporary layer 22 and the third temporary layer 23 have all been removed at once. Removal of the temporary layers 21, 22 and 23 in this way results in formation of the buckling assist groove 3, the space 28 between the heater 20 and the silicon substrate 7, and the space 29 between the buckling structure 2 and the diaphragm 5.

FIG. 3 illustrates the process of forming the ink-jet head shown in FIG. 1, according to an embodiment of the invention. For convenience of explanation of the present embodiment, portions corresponding to those of the first embodiment shown in FIG. 2 are indicated by the same reference numerals. According to the first embodiment, although the insulating film 18 which insulates the heater 20 is alkali-resistant, it is etched to a depth of several tens to several hundreds of angstroms each hour in a strongly alkaline aqueous solution. This inevitably impairs the portions shown in FIGS. 2B and 2C which are brought into direct contact with the strongly alkaline aqueous solution 27. According to the present embodiment, a temporary layer 31 which corresponds to the first temporary layer 21 of FIG. 2 is formed of two layers, a lower temporary layer 31a which is also formed of a positive-type photoresist film, and an upper temporary layer 31b formed of an amphoteric metal film. In order to remove the temporary layers, as shown in FIG. 3B, the temporary layer 31a which is the lower layer of the first temporary layer 31 is first removed with an organic solvent such as acetone. The constituent material of the insulating film 18, such as SiO$_2$, satisfactorily resists organic solvents, and thus no particular problems are presented even in cases where it is immersed in an organic solvent for a long time. A clearance 32 is formed in this way. A strongly alkaline aqueous solution then permeates through the clearance 32. Here, since the strongly alkaline aqueous solution rapidly permeates through the clearance 32 which enlarges as the lower layer 31b of the first temporary layer 31 is dissolved, the second and the third temporary layers 22, 23 may be removed in a short time. The insulating film 18, being not damaged by the long local exposure to the aqueous solution of the alkali, serves to increase the reliability of the resulting device.

FIG. 4 through FIG. 9 illustrate a method of forming the ink-jet head shown in FIG. 1, according to a third embodiment of the invention. The process according to the third embodiment proceeds in the order A through P; FIG. 4, FIG. 6 and FIG. 8 illustrate cross sectional views taken along the section line Y—Y shown in FIG. 1, and FIG. 5, FIG. 7 and FIG. 9 illustrate cross sectional views taken along the section line X—X in FIG. 1, respectively. The portions corresponding to those according to the first and the second embodiments are indicated by the same reference numerals for simplicity of explanation. According to the present invention, a heater for heating the buckling structure is provided above the buckling structure to heat the upper surface of the buckling structure to a higher temperature than its lower surface so that the buckling structure theoretically deforms in an upward direction, thus improving the efficiency. Location of the heater 20 below the buckling structure as according to the first and the second embodiments is not recommended from the point of view of efficiency, since this causes the lower surface of the buckling structure 2 to have a higher temperature than its upper surface, and thus may result in displacement of the buckling structure 2 to the side of the silicon substrate 7, rather than to the side of ink ejection. According to the first and second embodiments, the side groove 15 in the silicon substrate 7 is designed to have a small width to increase the area of contact of the silicon substrate 7 with the buckling structure 2, thus increasing the heatsink effect to facilitate the displacement in the direction of ink ejection. The small width of the side groove 15 in the silicon substrate 7, however, produces the problem of delayed permeation of the removing solution through the temporary layers and thus delayed removal of the temporary layers. According to the present embodiment, since the side groove 15 in the silicon substrate 7 may be enlarged toward its underside, the temporary layers may be quickly removed.

Figure 5A:
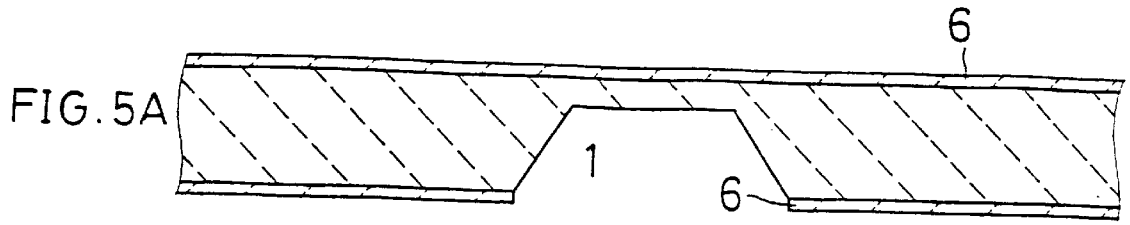
FIGS. 5A through 5F are other cross sectional views illustrative of the production process according to the third embodiment of the invention.
Figure 5B:
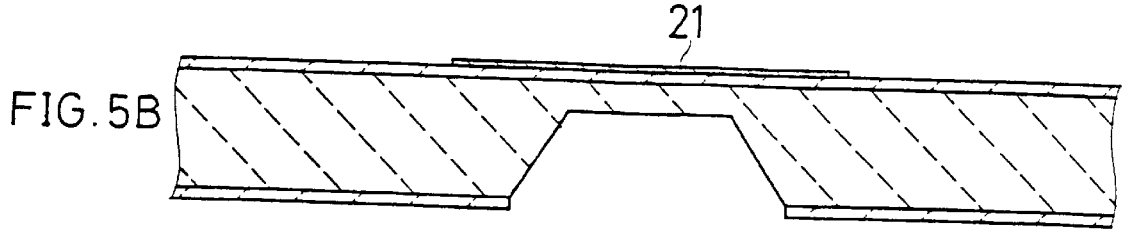

Referring to FIG. 4A and FIG. 5A, a thermal oxide film 6 with a given film thickness of, for example, 1–2 μm, is formed by thermal oxidation both the top side and the underside of the single-crystal silicon substrate 7 with surface orientation (100). A side groove 15 is formed in the underside by photolithography and etching with an aqueous solution of potassium hydroxide (KOH). Then, as illustrated in FIG. 4B and FIG. 5B, a 0.1–1 μm-thick film, which serves as the temporary film 21 for formation of a space to allow movement of the buckling structure 2, is formed by sputtering aluminum, and is then processed, by photolithograhy and etching, into a pattern which is required as the first temporary layer 21. The thickness of this temporary layer 21 determines the depth of the clearance 53 shown in FIG. 8P and FIG. 9P, which is described later.

Figure 5C:
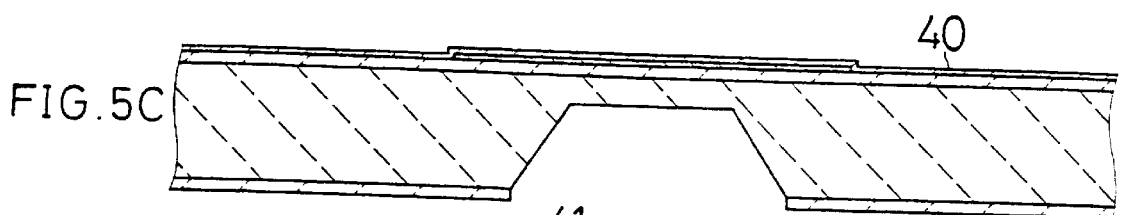
Figure 5D:
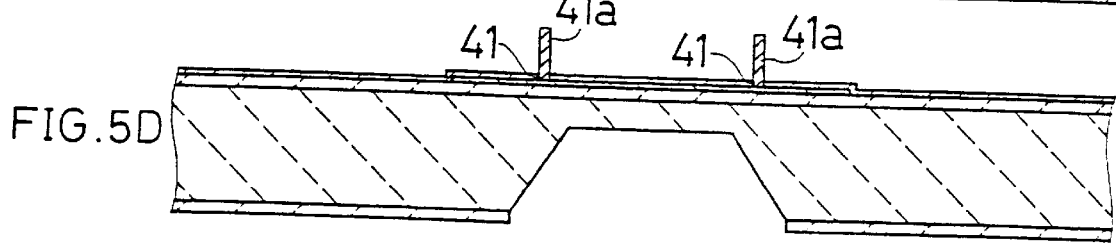
Figure 5E:
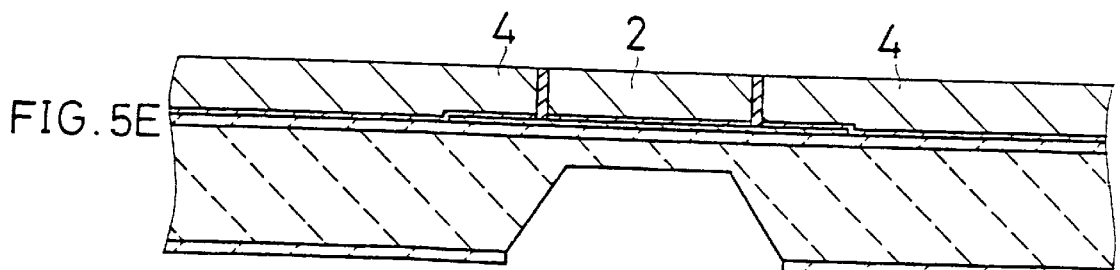
Figure 5F:
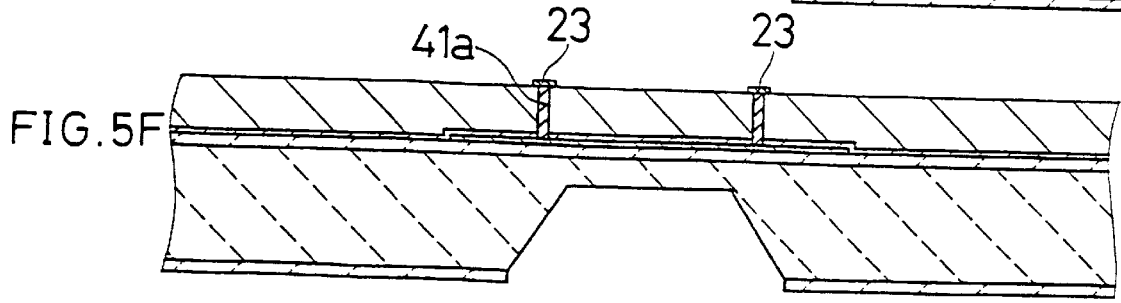

Then, as illustrated in FIG. 4C and FIG. 5C, for example, a tantalum (Ta)/nickel (Ni) film is formed as a plating seed layer 40 by sputtering or other methods. The tantalum serves as an adhesive layer between the thermal oxide film 6 and the buckling structure section 1, and other metals which are satisfactorily adhesive to SiO$_2$, such as chrominum (Cr), titanium (Ti), iron (Fe) and niobium (Nb) may also be used instead of tantalum. Then, as illustrated in FIG. 4(d) and FIG. 5(d), photolithography and ion milling are employed to remove the frame section 41 which leaves the buckling assist groove 3 for the buckling structure 2 when removed from the plating seed layer 40. A frame resist pattern 41a is then formed of a positive-type photoresist by photolithography. As illustrated in FIG. 4E and FIG. 5E, the buckling structure 2 and its peripheral supporting section 4 at the side of the silicon substrate 7 are then formed by nickel electroplating, for example. As illustrated in FIG. 4(f) and FIG. 5(f), the frame resist pattern 41a is then left as the second temporary layer. A film of an amphoteric metal material such as aluminum is then formed on the frame resist pattern 41a by an evaporation process such as electron beam (EB) evaporation at a substrate heating temperature of 150° C. or lower, and the third temporary layer 23 is patterned by photolithography and etching.

A first insulating film 43 is then formed as illustrated in FIG. 6G and FIG. 7G. The first insulating film 43 is for insulation of a heater layer 44 mentioned later. The material for the first insulating film 43 is preferably $SiO_2$ or SiN from the point of view of adhesion to the heater material and workability. The heater layer 44 is then formed on the first insulating film 43 as a film by sputtering. The heater layer 44 is preferably of a three-layer structure consisting of an adhesive layer/heater layer/adhesive layer located in that order from the side of the substrate, from the point of view of adhesion to the insulating film. Nickel, tungsten (W), Ni—Cr or the like may be used for formation of the heater layer 44, because of their resistibility. The adhesive layer is preferably formed of tantalum, chrominum, titanium, iron or niobium, for example, because of their high adhesion to the insulating film. The heater layer 44 is then patterned by photolithography and etching.

As illustrated in FIG. 6H and FIG. 7H, a second insulating film 45 is then formed by sputtering, for example. The material for the second insulating film 45 is preferably $SiO_2$ or SiN for the same reason as for the material for the first insulating film 43. The first insulating film 43 and the second insulating film 45 are then processed simultaneously by photolithography and etching to form a pattern 46 to allow movement of the buckling structure and a heater electrode outlet opening 47. As illustrated in FIG. 6I and FIG. 7I, an adhesive layer is formed as a film for intimate contact between a diaphragm 50 mentioned later and the second insulating film 45. Chrominum or zirconium (Zr) is desired as the material for the adhesive layer from the point of view of adhesiveness to the second insulating film 45 and resistance to strongly alkaline aqueous solutions used as the etching solution for the temporary layers. The adhesive layer is then processed into an adhesive pattern 48 by photolithography and etching. Here, portions of the adhesive layer, which are located above the electrode outlet opening 47 or correspond to the peripheral supporting section of the diaphragm, are left.

As illustrated in FIG. 6J and FIG. 7J, a fourth temporary layer is then formed as a film of an amphoteric metal. This fourth temporary layer may be formed by either evaporation or sputtering, since the second temporary layer 41a made of a positive-type photoresist film has already been protected by the third temporary layer 23. Here, however, care should be taken to prevent the temperature from increasing to 150° C. or higher. Photolithography and etching are then employed to form a pattern 49 of the fourth temporary layer. As illustrated in FIG. 6K and FIG. 7K, a plating seed layer 50 for the diaphragm 5 is then formed as a film. The material for the seed layer 50 may be the same metal material as that for the diaphragm 5, for example, nickel, and the film may be formed by sputtering.

Figure 8L:
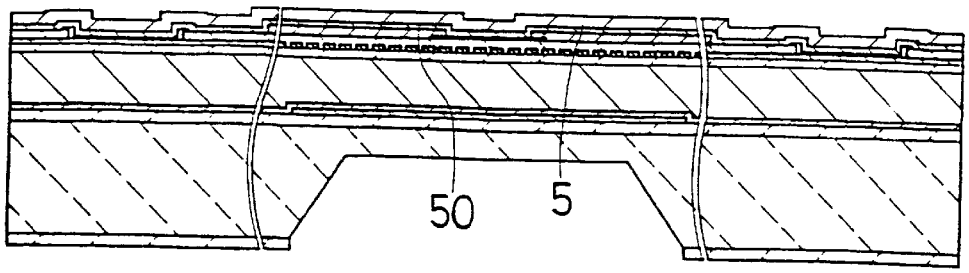
FIGS. 8L through 8P are yet other cross sectional views illustrative of the production process according to the third embodiment of the invention.
Figure 8M:
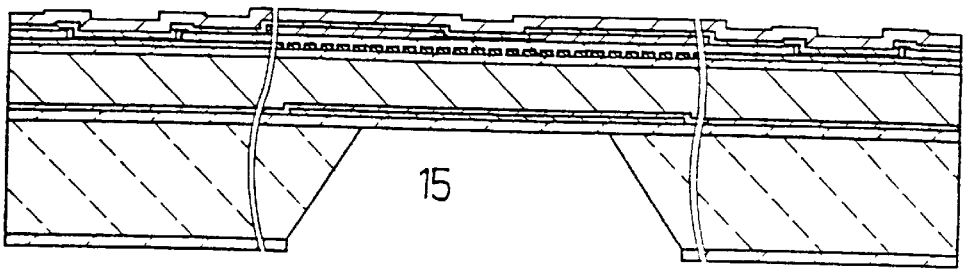
Figure 8N:
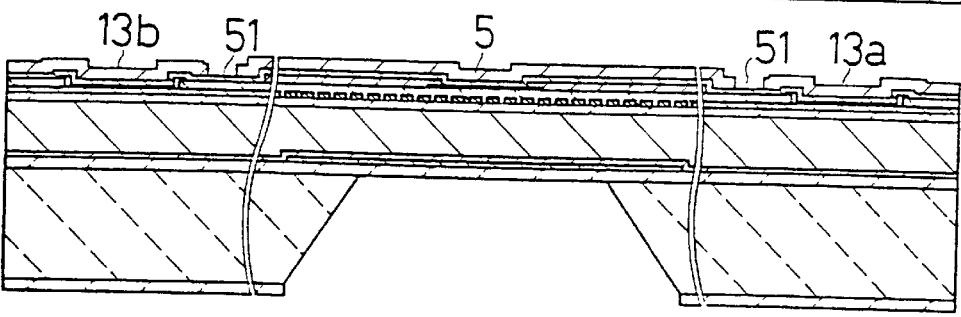
Figure 8O:
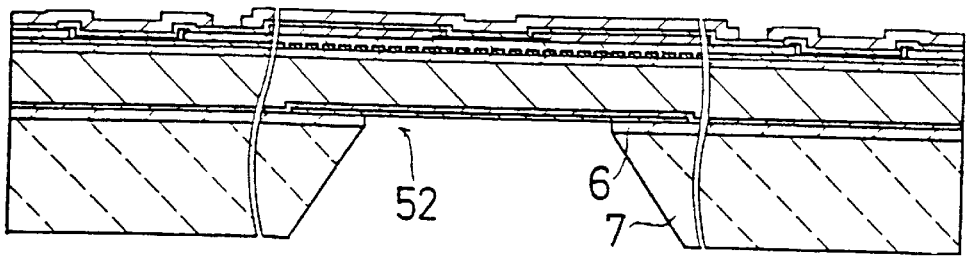
Figure 8P:
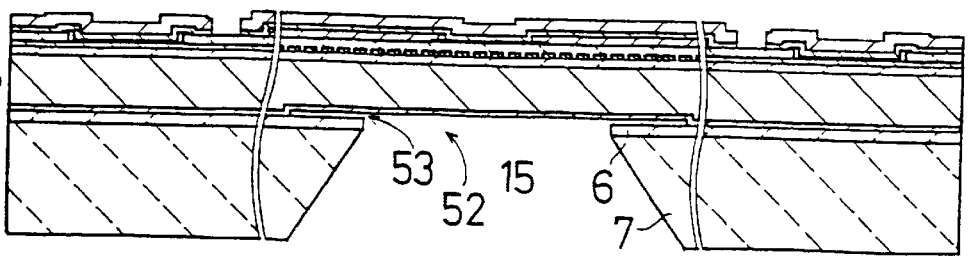
Figure 9L:
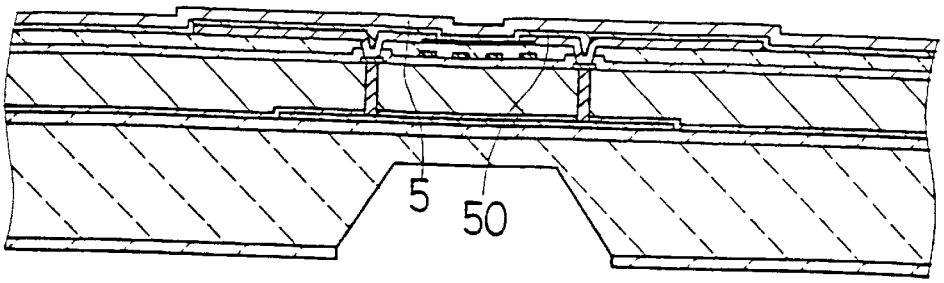
FIGS. 9L through 9P are yet other cross sectional views illustrative of the production process according to the third embodiment of the invention.
Figure 9M:
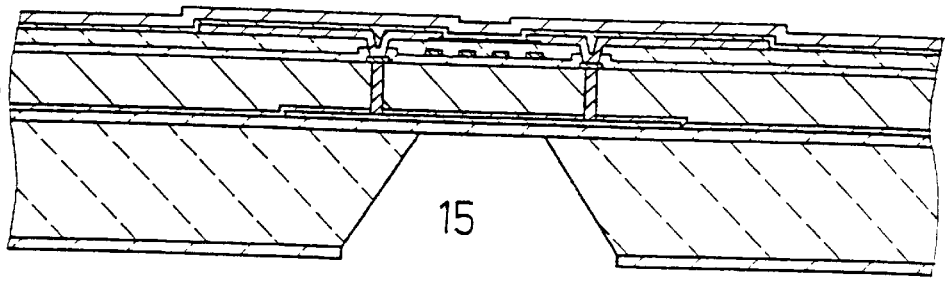
Figure 9N:
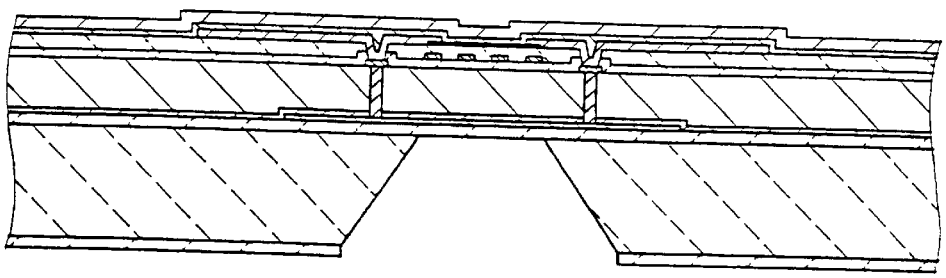
Figure 9O:
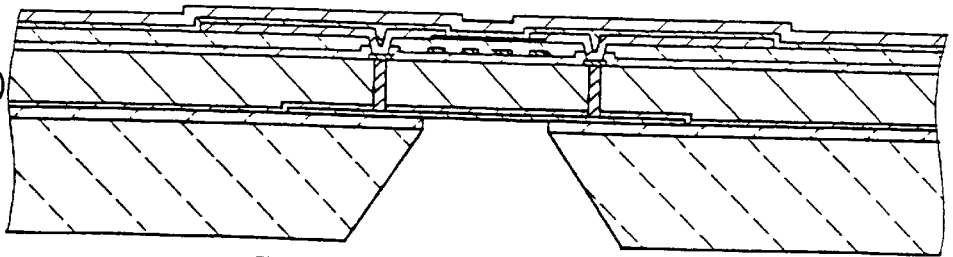
Figure 9P:
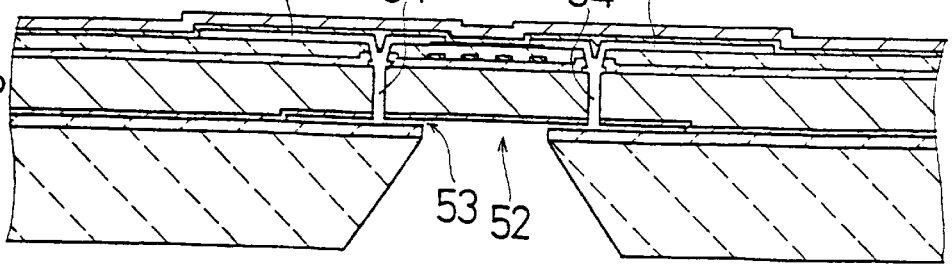
Figure 10A:
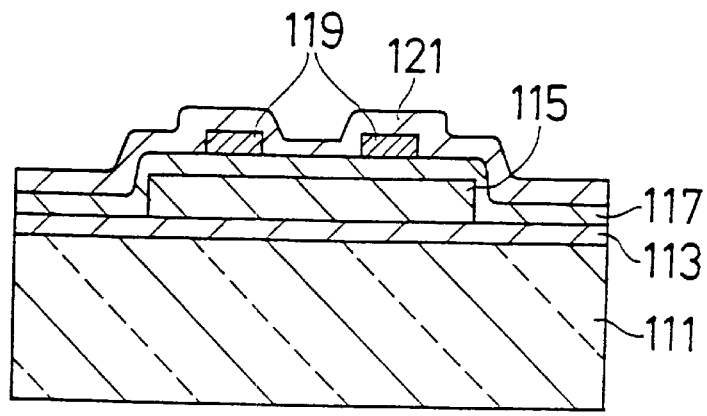
FIGS. 10A and 10B are cross sectional views illustrative of a conventional production process.
Figure 10B:
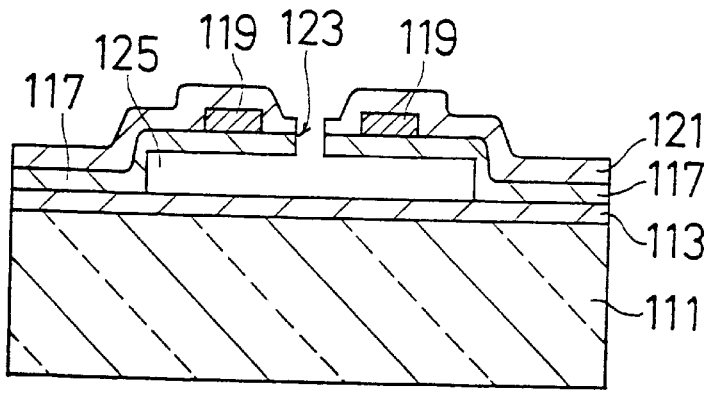
Figure 11A:
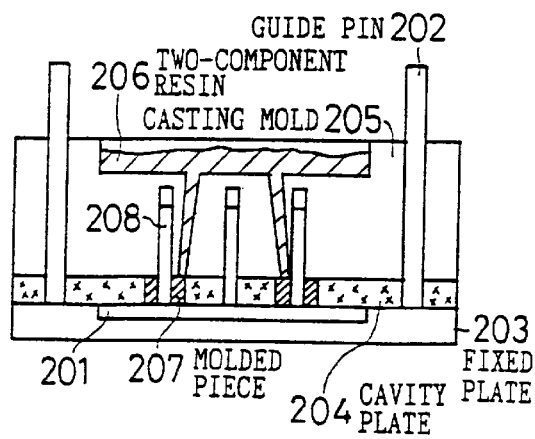
FIGS. 11A through 11F are cross sectional views illustrative of another conventional production process.
Figure 11B:
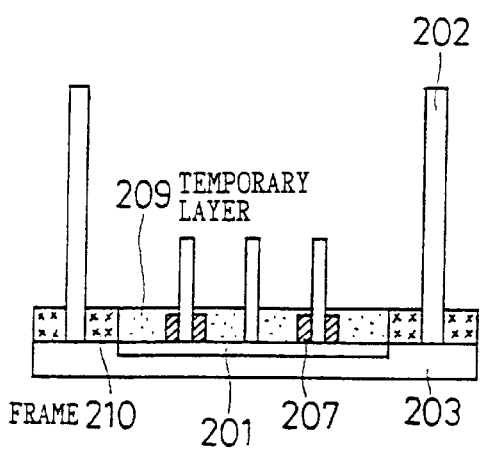
Figure 11C:
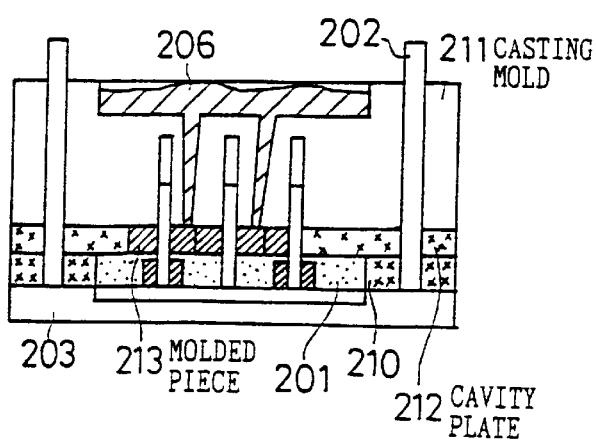
Figure 11D:
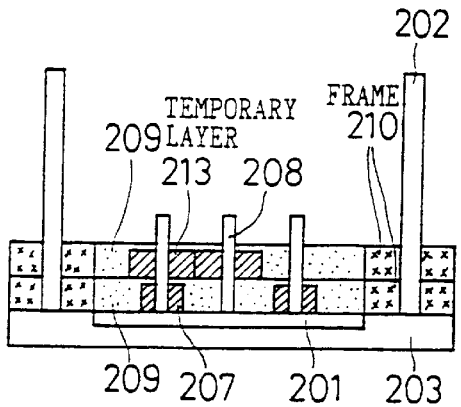
Figure 11E:
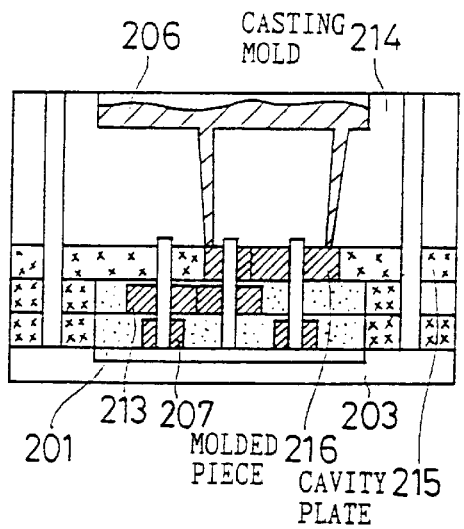
Figure 11F:
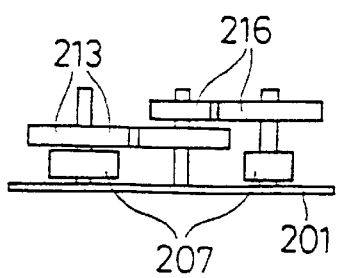
Figure 12A:
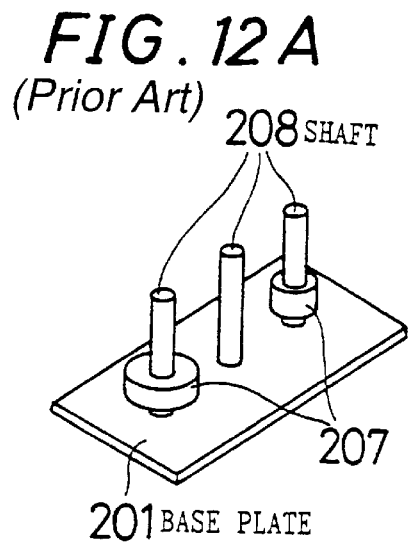
FIG. 12A through 12F are perspective views of parts produced by the corresponding production processes illustrated in FIG. 11.
Figure 12D:
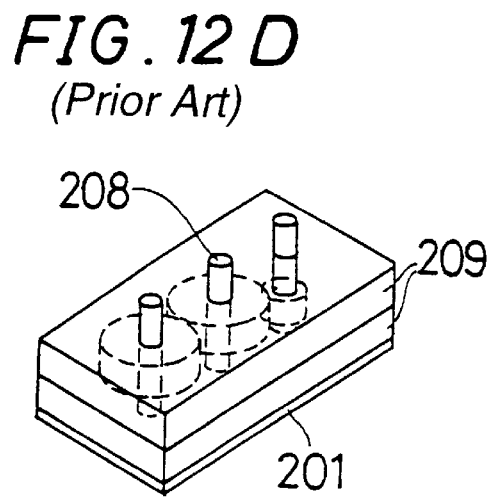
Figure 12B:
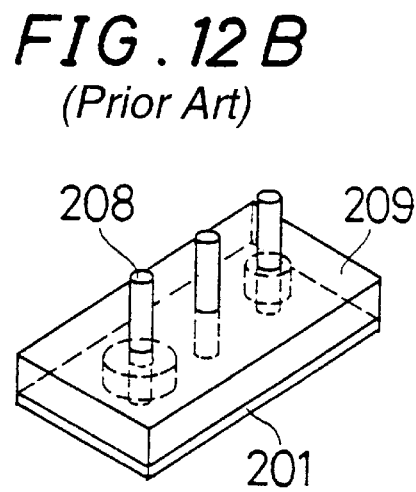
Figure 12E:
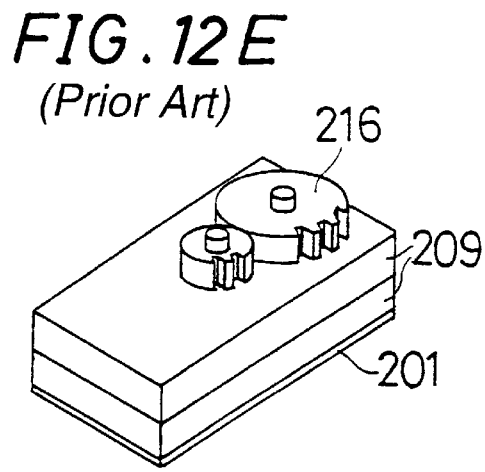
Figure 12C:
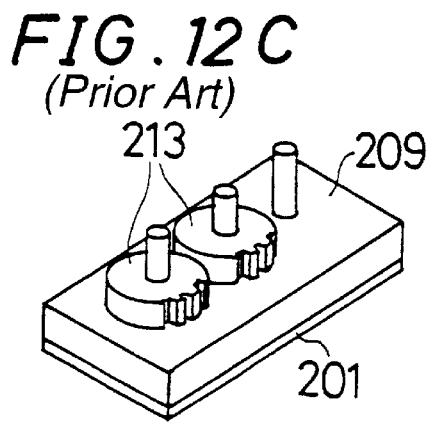
Figure 12F:
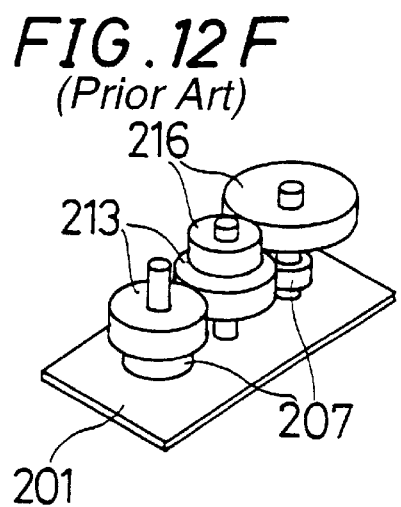

As illustrated in FIG. 8L and FIG. 9L, nickel electroplating is applied onto the seed layer 50 to form the diaphragm 5. As illustrated in FIG. 8M and FIG. 9M, the underside of the silicon substrate 7 is etched in an aqueous solution of potassium hydroxide, for example, to complete the side groove 15. As illustrated in FIG. 8N and FIG. 9N, a groove 51 is then formed in the film of the diaphragm 5 which is formed as illustrated in L, by photolithography and etching to provide electric isolation between the electrode sections 13a, 13b at the opposite sides. As shown in FIG. 8O and FIG. 9O, the portion of the thermal oxide film 6 which faces the side groove 15 and the entire thermal oxide film 6 facing the underside of the silicon substrate 7 are removed to create an inlet opening 52 for a temporary layer-removing solution. The removal of the thermal oxide film 6 is carried out by reactive ion etching (RIE) with $CHF_3$ gas, for example. As illustrated in FIG. 8P and FIG. 9P, a strongly alkaline aqueous solution, for example, an aqueous solution of potassium hydroxide or a developing agent for a positive-type photoresist, as the temporary layer-removing solution, is then introduced through the side groove 15 in the underside and the opening 52 in the thermal oxide film 6 to remove the first, second, third and fourth temporary layers to thereby form clearances 53, 54 and 55. Although the use of an aqueous solution of potassium hydroxide causes etching into the underside of the silicon substrate 7, this does not result in any serious problem, since the silicon substrate 7 is several hundred $\mu$m thick. The silicon substrate section of a below-heater buckling structure-driven diaphragm type ink-jet head is completed in the manner described above.

Silicon substrate sections of a buckling structure-driven diaphragm type ink-jet head are formed according to the first through third embodiments, minite driving elements may also be produced according to the present invention. In addition, minite parts as described in Japanese Unexamined Patent Application Disclosure HEI 6-39939 may be easily formed by designing a thick temporary layer made of an organic material, without using a cavity plate and a frame.

As described above, according to the invention, since a temporary layer is composed of a lower layer made of an organic material and an upper layer made of an amphoteric metal, the temporary layer may be readily removed in a selective manner with a removing solution which less damages the three-dimensional structure formed thereon.

Also, according to the invention, the lower layer of a temporary layer is completely covered with the upper layer or with the constituent material of the upper layer, the lower layer may be protected against etching solutions and peeling solutions used for selective removal of the upper layer.

Also, according to the invention, since the lower layer of the temporary layer is formed as a thin film with a thickness of 0.1–1 $\mu$m, it may be quickly removed with an organic solvent which is highly selective to the organic material. Since permeation of a strongly alkaline aqueous solution through the clearance formed after the lower layer has been removed, allows instant removal of the upper layer made of an amphoteric metal, even in cases where the alkali resistance of the three-dimensional structure formed on the temporary layer is poor, and the temporary layer has a large area and small thickness, the temporary layer may be quickly removed without seriously damaging the constituent material.

Also, according to the invention, since the lower layer of the temporary layer is formed as a thick film 1–100 $\mu$m thick, a temporary layer may easily be formed as a thick film.

Also, according to the invention, since the temporary layer is formed as a multiple layer, a three-dimensional structure in a complex shape may be provided with ease.

Also, according to the invention, since the upper layer and the lower layer of the temporary layer are alkali-soluble, the temporary layer may be quickly removed, less damaging the constituent material, by using a strongly alkaline aqueous solution which is highly selective to the constituent material of the three-dimensional structure, thus improving the productivity as well.

In addition, since the positive-type photoresist used as an organic material for the formation of the lower layer of the temporary layer according to the invention is readily soluble in a variety of solvents, and thus the invention is highly compatible with IC production processes, etc.

Also, the use of aluminum for the formation of the upper layer of the temporary layer according to the invention is advisable due to its compatibility with IC production processes and because a variety of processing methods may be used. Positive-type photoresists, when used for the formation of the lower layer of the temporary layer, may be removed with a developing solution.

Also, according to the invention, since the lower layer is not deteriorated by carbonization or curing when the upper layer of the temporary layer is formed on the lower layer, the lower layer may be readily removed even after the formation of the upper layer. In addition, in cases where a thin film made of an organic material is formed on a thin film made of the same amphoteric metal material as that constituting the upper layer of the temporary layer, the temporary layer formed as an amphoteric metal film by evaporation protects the temporary layer made of an organic material against ion collisions, thus allowing formation of a thin film, by sputtering or other methods, for the formation of a complex three-dimensional structure on the temporary layer made of an organic material, without damaging the temporary layer made of an organic material.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A method of forming a microstructure for the production of a minute part with a composite structure, said method comprising the steps of:

forming a plurality of layers as thin films; and selectively removing at least one of the plurality of layers as a temporary layer, wherein the temporary layer is formed as a composite of a lower layer composed of an organic material and an upper layer composed of an amphoteric material which is formed on the lower layer.

2. The method according to claim 1, wherein the lower layer is completely covered with at least one of the upper layer or constituent materials of the upper layer during the formation of a pattern of the upper layer.

3. The method according to claim 2, wherein the lower layer has a film thickness of 0.1–1 $\mu$m, and is selectively removed with an organic solvent, and the upper layer is selectively removed with a strongly alkaline aqueous solution.

4. The method according to claim 1, wherein the lower layer has a film thickness of 1–100 $\mu$m.

5. The method according to claim 1, wherein one or more selectively removable thin films are layered on the temporary layer to form a plurality of temporary layers.

6. The method according to claim 1, wherein the temporary layer is selectively removed with a strongly alkaline aqueous solution.

7. The method according to claim 1, wherein a positive-type photoresist is used as the organic material.

8. The method according to claim 1, wherein the amphoteric material is aluminum.

9. A method of forming a microstructure for the production of a minute part with a composite structure said method comprising the steps of:

forming a plurality of layers as thin films; and selectively removing at least one of the plurality of layers as a temporary layer.

wherein the temporary layer is formed as a composite of a lower layer composed of an organic material and an upper layer composed of an amphoteric material which is formed on the lower layer, and wherein the upper layer is formed on the lower layer through evaporation while maintaining the lower layer at a temperature lower than the deformation temperature of the organic material.

10. A method of forming a microstructure for the production of a minute part with a composite structure, said method comprising the steps of:

forming a plurality of layers as thin films wherein one of the plurality of layers is an upper temporary layer formed on a second of the plurality of layers which is a lower temporary layer, said upper temporary layer and said lower temporary layer defining a temporary layer pair; and removing the upper temporary layer and the lower temporary layer, wherein the lower temporary layer is composed of an organic material and the upper temporary layer is composed of an amphoteric material, wherein the upper temporary layer and the lower temporary layer each occupies a volume which, when vacated by said removing step, at least partially defines a shape of said minute part.

11. The method according to claim 10, wherein the lower temporary layer is removed before the upper temporary layer is removed.

12. The method according to claim 10, wherein the lower temporary layer is completely covered with at least one of the upper temporary layer or constituent materials of the upper temporary layer during the formation of the upper temporary layer.

13. The method according to claim 11, wherein the lower temporary layer has a film thickness of 0.1–1 $\mu$m, and is selectively removed with an organic solvent, and the upper temporary layer is selectively removed with a strongly alkaline aqueous solution.

14. The method according to claim 10, wherein the lower temporary layer has a film thickness of 1–100 $\mu$m.

15. The method according to claim 10, wherein the temporary layer pair is a first temporary layer pair, and wherein a second temporary layer pair is layered on the first temporary layer pair.

16. The method according to claim 10, wherein the temporary layer pair is selectively removed with a strongly alkaline aqueous solution.

17. The method according to claim 10, wherein a positive-type photoresist is used as the organic material.

18. The method according to claim 10, wherein the amphoteric material is aluminum.

19. The method according to claim 10, wherein the upper temporary layer is formed on the lower temporary layer through evaporation while maintaining the lower temporary layer at a temperature lower than the deformation temperature of the organic material.

* * * * *